United States Patent
Bair et al.

(10) Patent No.: US 7,089,518 B2
(45) Date of Patent: Aug. 8, 2006

(54) METHOD AND PROGRAM PRODUCT FOR MODELLING BEHAVIOR OF ASYNCHRONOUS CLOCKS IN A SYSTEM HAVING MULTIPLE CLOCKS

(75) Inventors: Dean Gilbert Bair, Bloomington, NY (US); Edward James Kaminski, Jr., Wynnewood, PA (US); Bradley Sterling Nelson, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 10/841,729

(22) Filed: May 8, 2004

(65) Prior Publication Data

US 2005/0251773 A1    Nov. 10, 2005

(51) Int. Cl.
*G06F 17/50* (2006.01)
(52) U.S. Cl. .................... 716/6; 716/4; 716/5
(58) Field of Classification Search .............. 716/6, 716/5, 4; 375/354
See application file for complete search history.

(56) References Cited

U.S. PATENT DOCUMENTS

| | | | | |
|---|---|---|---|---|
| 4,979,190 | A | * 12/1990 | Sager et al. | 375/354 |
| 5,790,830 | A | 8/1998 | Segal | 395/500 |
| 6,321,184 | B1 | 11/2001 | Baumgartner et al. | 703/15 |
| 6,785,873 | B1 * | 8/2004 | Tseng | 716/4 |
| 6,892,314 | B1 * | 5/2005 | Chen | 713/401 |
| 6,956,788 | B1 * | 10/2005 | Nguyen et al. | 365/233 |
| 6,957,403 | B1 * | 10/2005 | Wang et al. | 716/3 |
| 2005/0069068 | A1 * | 3/2005 | Gundurao et al. | 375/354 |

* cited by examiner

*Primary Examiner*—A. M. Thompson
*Assistant Examiner*—Tuyen To
(74) *Attorney, Agent, or Firm*—Lynn L. Augspurger; Richard M. Goldman

(57) ABSTRACT

Method and program product for analyzing an asynchronously clocked system. The system being analyzed has independently clocked subsystems with clock boundaries therebetween. The model identifies a boundary between the two independently clocked subsystems, and identifies behavior at the boundary between the two independently clocked subsystems. and modeling a latch at the boundary between the two independently clocked subsystems with a behavior model, said behavioral model comprising data receiver time delays.

16 Claims, 4 Drawing Sheets

METHOD AND PROGRAM PRODUCT FOR MODELLING BEHAVIOR OF ASYNCHRONOUS CLOCKS IN A SYSTEM HAVING MULTIPLE CLOCKS

BACKGROUND OF THE INVENTION

1. Field of the Invention

This invention relates to logical verification of digital designs characterized by asynchronous communication between two or more clock sections. That is, the clocks in different systems or different sub-systems in a system may be running at different speeds and the phase relationship between the clock sections may be constantly changing. This condition is increasingly prevalent as cycle times decrease to allow local sections of logic to run as fast as they possibly can without being forced to run slower due to another section of logic or off chip logic which has a higher or lower maximum clock rate. Asynchronous clocking is also in wide use for communications chips tying multiple parts together, all of which may be running at different speeds. Under these asynchronous clocking conditions, the design may experience periods of metastability at the boundaries between clock sections. This may be due to variable phase relationship of the clocks, rise and fall times of signals, and setup times for capturing the data in the receiving clock section.

2. Description of Background

Hardware descriptions languages (referred to herein as "HDL's") are used to design logic circuits and to verify the design correctness and behavior of logic circuits. This includes verifying asynchronous behavior, for example the asynchronous behavior observed on the IBM z-series processor, L2 cache controller and L3 memory controller interface. As a general rule, asynchronous behavior is included in the design to allow processors, cache controllers, and memory controllers to run at their individual, local optimum speed for each unit without concern for the maximum clock speeds of the other elements.

One problem is the difficulty encountered in detecting design problems on an asynchronous boundary between clock sections with variable phase relationships. This is especially severe in a cycle simulator because of the synchronous nature of the simulator engine itself. In a cycle simulator with a synchronous simulator engine, even if the clocks are run at different relative rates in the clock sections, they are still "synchronized" at the simulator clock boundary. As a result, some artifacts attributed to asynchronous boundary crossings may not present in the simulation, like glitches, different rising/falling edge times on individual bits in a multibit bus, and short pulse widths which may be missed by the logic on the receiving clock section.

Similarly, the metastability behavior of the asynchronous crossings was emulated using software working through the simulator applications program interface (API), but this solution does not match the performance of a HDL solution on a cycle simulator and provides extremely poor performance on a hardware emulator.

SUMMARY OF THE INVENTION

The shortcomings of the prior art are overcome and additional advantages are provided through the incorporation in an HDL or the augmentation of an HDL with the replacement for the latch models at the asynchronous interfaces. The HDL models have extra logic to emulate a variety of metastability actions that might be encountered in the physical design on single or multiple bit buses and work not only in event simulators but also in cycle simulators and hardware emulators.

The invention provides a method and program product for analyzing an asynchronously clocked system. The system being analyzed is one having independently clocked subsystems with clock boundaries therebetween. The method and program product provide identification of a boundary between the two independently clocked subsystems, identifying behavior at the boundary between the two independently clocked subsystems; and modeling a latch at the boundary between the two independently clocked subsystems. The modeling is with a behavior model. The behavioral model models data receiver time delays.

The delays are user selectable, for example by masking. The delays are selectable between early, normal, and late receiver times and switchable between the receiver times. In addition to delays the behavior model may also include glitches.

The method and program product are useful for modeling systems with L2 latches and systems with L1 and L2 latches. Additionally, the method and program product can combine asynchronous latch behavior with variable clock section clocking ratios.

In a still further example, the method and program product can model independent behavior for individual bits of a multi-bit bus and for individual buses of an interface.

An additional advantage of the method and program product of the invention is the capability of overcoming the poor execution speed performance of the API solution by providing an HDL solution which will run efficiently in a simulator because the simulator is designed specifically to run HDL designs and is optimized toward that end. The HDL provides all of the required function to exercise the capabilities of the logic design to handle the metastability effects which may lead to design failures in a physical model due to asynchronous boundary crossings. The invention improves the earlier, error prone practice of running the clocks on the asynchronous clock sections at different rates by creating metastability behavior that is not produced by running at different clock rates.

This is especially true in a cycle based simulator, and is due to the inherent synchronizing effects of the simulator itself.

The method and program product described herein also allows the simulation model to be clocked more effectively in some cases because the effects of the asynchronous clocking can still be modeled, even if the disparate clocking sections are clocked at the same rate in the model. For example, if clock section A is running at 1.8 ns and clock section b is running at 1.9 ns, to model the same relationship, the simulator might be clocked with 18 simulator cycles for one logical cycle on clock section A, and 19 simulator cycles for logical cycle on clock section B, and, depending on the simulator used, could degrade performance by almost 20×.

The method and program product described herein models different switching times for individual bits on a multibit bus, as well as separate single buses that are used interactively on the receiving side. The method and system of the invention also models short pulses, or long pulses that would be experienced from the receiving side's point of view due to the variable clock phase relationship between asynchronous clocking sections. Glitches can also be modeled when the design is engineered to handle this extreme case or to determine if the design can handle this extreme case.

Modifying the behavior of the logic at an asynchronous boundary can be used in conjunction with different cycle times within the clocking sections where appropriate. Some care may be needed not to exceed the capabilities of the design with respect to the duration of signal states as both the behavior change and the clock ratio can have an affect on this.

The technique may be extended to handle verification of array structured buffers that communicate across asynchronous boundaries by replacing the behavior of the buffers. This method is extendable to any custom behavior for an asynchronous crossing or design behavior that does not follow the usual switching behavior (maybe a 'weak' driver that may have trouble reliably achieving rise times to support the required receiving setup times) where a block of HDL can be substituted to provide different behavior in the simulation model.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

DEFINITIONS

Certain terms and expression used herein having the following meaning:

As used herein, a "Hardware Definition Language" ("HDL") is a language used to model a hardware system at various levels of abstraction through the concepts of entity, connectivity, concurrency, and hierarchy.

The levels of abstraction are, with increasing abstraction, structure, dataflow, and behavior.

As used herein "Behavior" refers to a level of abstraction characterized by performance specifications, test benches, sequential descriptions, and state machines. Typically, a "test bench" written in conjunction with a "sequential description" is an expression of a system design suitable for a behavioral simulation.

As used herein a "latch" is a hardware device that holds its value after a clock pulse or input pulse, for example, a "set" or "reset" pulse, even after removal of the clock pulse or input pulse.

As used herein Level 1 ("L1") and Level 2 ("L2") latches are series connected latches where the output of the L1 latch is the input to the L2 latch.

As used herein, a "glitch" is the detection of a switching signal going through multiple states while changing from the initial state and before settling at the target state.

As used herein an "asynchronous boundary" is a boundary between independently clocked subsystems.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
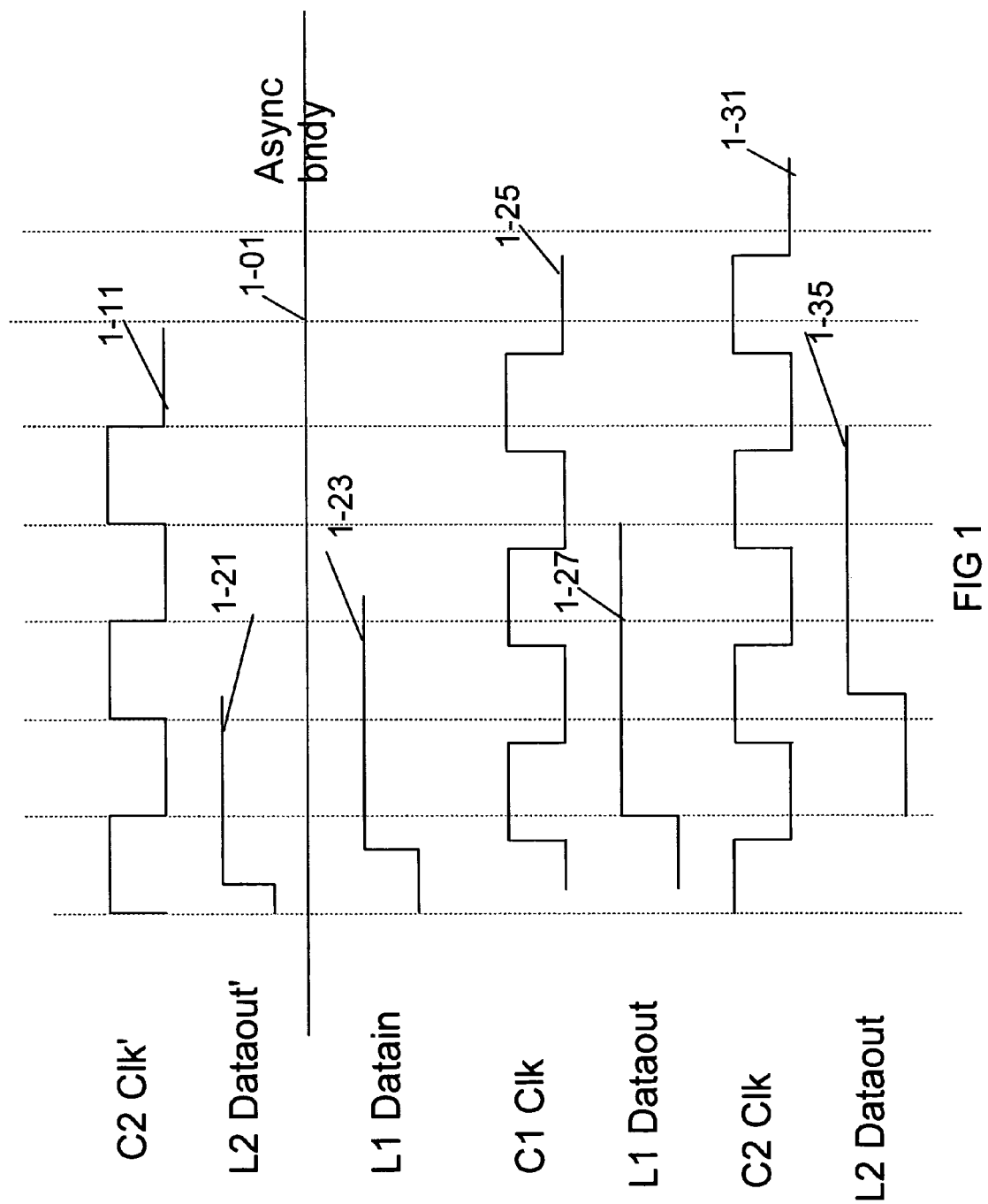
FIG. 1 illustrates one example of latch behavior when clock alignment permits normal L1–L2 latching.

The detailed description explains the preferred embodiments of the invention, together with advantages and features, by way of example with reference to the drawings.

DETAILED DESCRIPTION OF THE INVENTION

There are many pitfalls that may be encountered in logic designs containing multiple clock sections running asynchronously, such that the phase relationship between the clocks on one section of logic (a clock section) is not known, or is continuously changing, relative to the clocks on another clock section. Problems may be encountered due to combinational logic that is hanging between driving latches and receiving latches on the async boundary, early capture by the receiving logic, late capture by the receiving logic, or different effective arrival times of individual bits on a physical or logical multi-bit bus. Due to the inherent synchronous nature of cycle simulators, many of these problems are not fully realized in a cycle simulation or hardware accelerator environment and can be missed.

The method and program product described herein provides a way to emulate these types of problems using an HDL solution. The HDL solution can be used for cycle simulation and hardware accelerator environments by replacing the behavior of one or more latches or other logical blocks. The new behavior, described herein, contains logic to emulate early and late arrival of data and to also emulate the glitches that may occur when combinational logic is used across an asynchronous boundary.

The behavior model described herein uses a pseudo-random number generator and a mask to control the types of behavior to be tested. Each bit can behave differently to model multi-bit bus actions. The behavior can be set up to behave as the logic normally would, using the mask when asynchronous behavior is not desired.

The invention provides a method and program product for analyzing an asynchronously clocked system. The system being analyzed is one having independently clocked subsystems with clock boundaries therebetween. The method and program product provide identification of a boundary between the two independently clocked subsystems, identifying behavior at the boundary between the two independently clocked subsystems; and modeling a latch at the boundary between the two independently clocked subsystems. The modeling is with a behavior model. The behavioral model models data receiver time delays.

The delays are user selectable, for example by masking. The delays are selectable between early, normal, and late receiver times and switchable between said receiver times. In addition to delays the behavior model may also include glitches.

The method and program product are useful for modeling systems with L2 latches and systems with L1 and L2 latches. Additionally, the method and program product can combine asynchronous latch behavior with variable clock section clocking ratios.

In a still further example, the method and program product can model independent behavior for individual bits of a multi-bit bus and for individual buses of an interface.

1. Identification of Asynchronous Boundaries within the Logic

Figure 2:
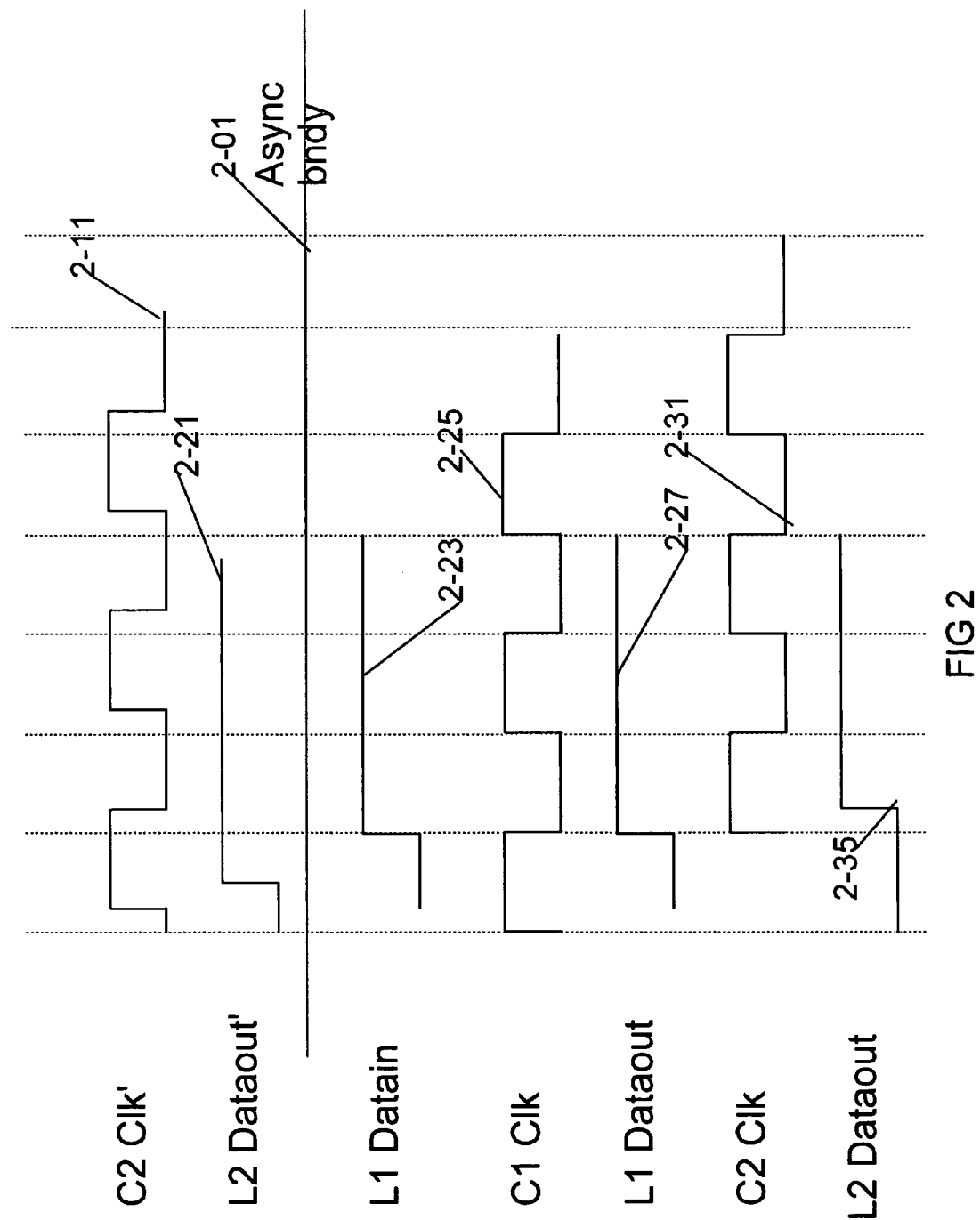
FIG. 2 illustrates one example of latch behavior when clock alignment causes the latch on the receiving side of the asynchronous boundary to behave as an L2 only latch as data is flushed through the L1 portion of the latch.
Figure 3:
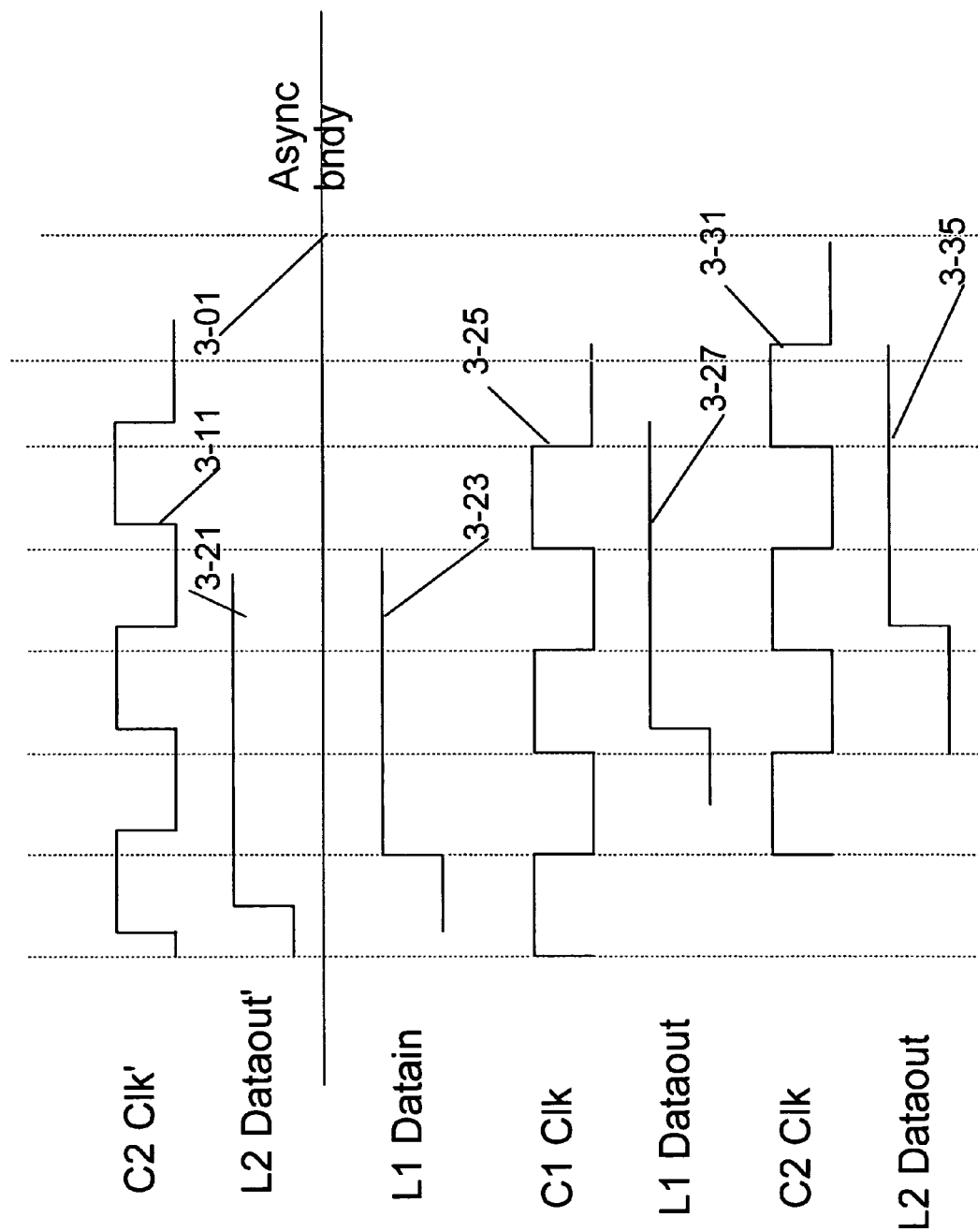
FIG. 3 illustrates one example of latch behavior when the incoming data is 'just missed' by the receiving L1 clock and is ingated late, at the next clock receiving C1 clock edge.

The first step to implementing a solution with this invention is to identify the asynchronous boundaries within the logic. The asynchronous boundary is a boundary between independently clocked subsystems. Asynchronous boundaries are shown in FIGS. 1, 2, and 3 as elements 1-01, 2-01, and 3-01. This can be done with designer input, design review or using an automated program that calculates which parts of the logic are on which clock sections and identifies any interconnections between clock sections. Once the sections are identified the asynchronous behavior can be substituted into the HDL model and the HDL model built. The new behavior with asynchronous clocks and element delays can be set up with a pseudo-random number generator seed to activate all of the potential problem behavior. It may not always be necessary or even appropriate to activate all of the potential problem behavior due to the design point. If it is known, or can be determined or proven that some behavior will not occur, the setup can reflect that and activate only the behavior needed to test the design. For instance, if care is taken to avoid using combinational logic within the asynchronous crossings, glitch behavior can usually be disabled, and the design need not be tolerant of it.

2. Characterization of the Receiving Latch

Figure 4:
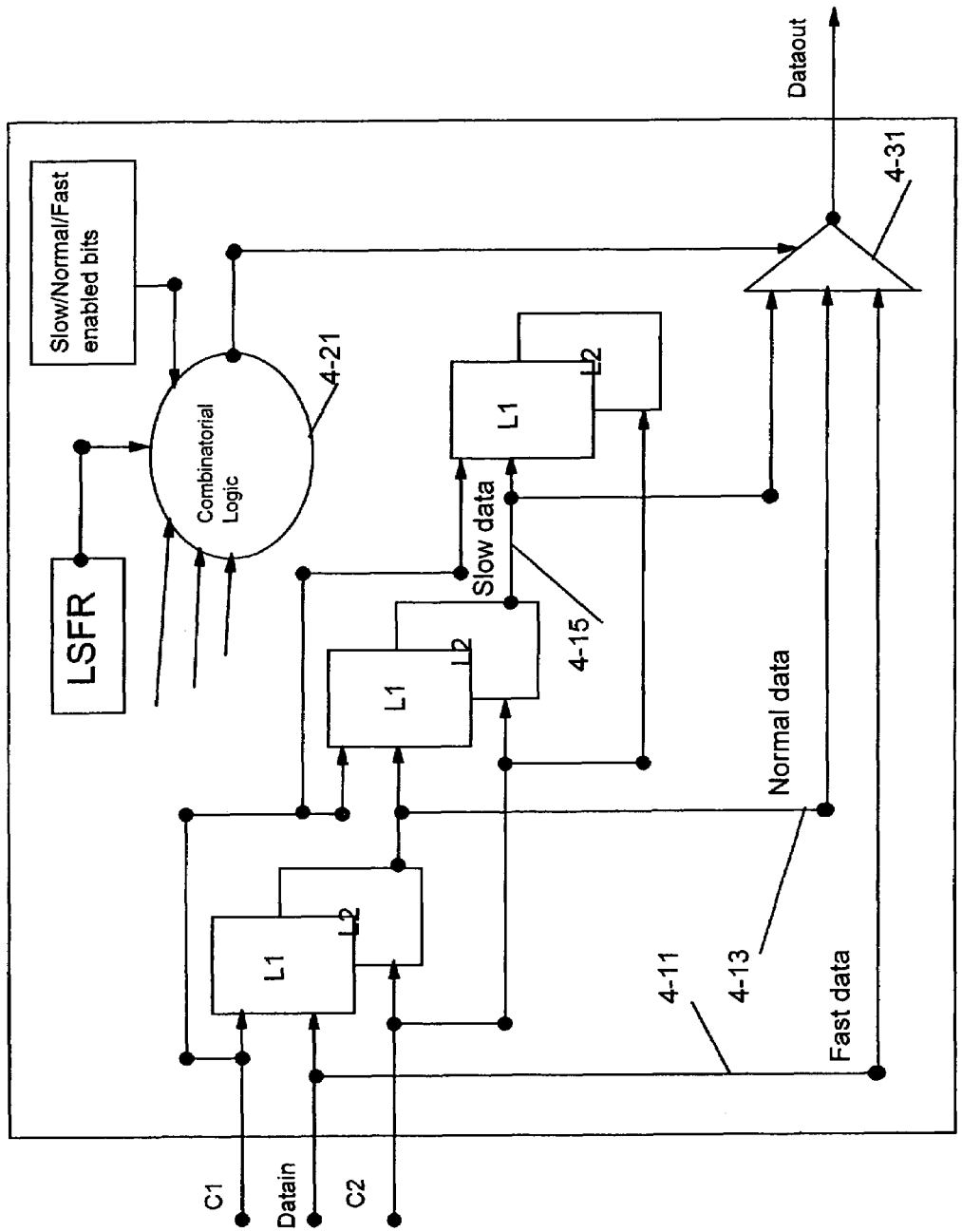
FIG. 4 is a simplified block diagram of the receiving asynchronous latch model that supports modeling of 'fast' data (L1 flush), normal data, and 'slow' data (L1 ingate delayed) with mask controlled, pseudo-random switching between these three modes.

The behavior of the receiver latch described herein takes advantage of the fact that asynchronous crossings at asynchronous boundaries can be characterized at the receiving side as early, normal, or late arrivals relative to the receiving clock pulse, or as glitches where the signal makes multiple transitions during the switching time. In order to achieve the different timings and the glitching behavior, the latch uses a MUX internally to select from a fast path 4-11, a normal path 4-13, or a slow path 4-15, at any given time as shown in FIG. 4. Besides the data path in the latch, there is also control logic 4-21 to switch the selector input for the MUX 4-31 and to mask off any switching states which are unwanted.

The normal path as shown in FIG. 1 for timing, takes the incoming data from the first latch L2 output 1-21 and passes it to the mux. The normal path is taken when L1/L2 clocking interlock on the receiving side is operating such that data coming across the boundary is ingated into the L1 of the receiving latch 1-23 by the receiving L1 clock 1-25 and then the L1 latch output 1-27 is gated into the L2 on the next L2 clock 1-31 such that approximately a full cycle of the receiving clock has passed before the change on the signal crossing the asynchronous boundary is presented on the output of the receiving L2 latch 1-35. This occurs when the signal being driven across the asynchronous boundary 1-01 changes to a new state while C2 1-31 is active in the receiving latch and at or before C1 1-25 rising in the receiving latch. The clocks have close to synchronous behavior in this case.

The fast path having the timing diagram shown in FIG. 2 takes the incoming data and passes it directly through the mux and to the output of the data. This makes the latch behave 'transparently' like a wire. It is a condition which can occur in asynchronous interface design when the C1 clock 2-25 of the receiving latch is active during the C2 clock 2-11 of the driving logic allowing the data arriving at the L1 latch 2-23 to pass into the L1 latch and be presented at the L1 output 2-27 immediately and avoiding the usual interlock between L1 and L2 latches. Further, if the L2 2-31 clock on the receiving side becomes active while the C2 2-21 of the driving side is still active, the data will pass from the receiving L1 2-23 and be ingated to the receiving L2 and be output from the latch 2-35. This occurs when the clocks of the receiving side are raising C2 2-31 shortly after the signal being driven across the asynchronous boundary changes to a new state with just enough setup time to ingate into the receiving L1 2-23. It is characterized by timing for the receiving latch to output the new signal value being less than the width of the receiving clock pulse.

The slow path having the timing diagram shown in FIG. 3 takes the incoming data from the second latch L2 output 3-21 and passes it to the mux. The slow path is taken when the signal across the asynchronous boundary changes close to the receiving C1 clock 3-25 dropping such that the signal just misses being ingated to the L1 latch 3-23 on the receiving side. The worst case of this 'just missing' occurs in the window before C1 3-25 drops with not quite enough time after the signal change to meet the setup time required to ingate the signal into the L1 3-21 portion of the latch. In this case, the receiving side waits for the next C1 clock rise 3-25 to ingate the incoming signal 3-23 into the receiving L1 3-21 and present it at the L1 output 3-27, which can be nearly a full receiving clock cycle later. So, the signal is ingated into the receiving L1 3-21 a full receiving cycle later to use 3-27 to tag the output of the receiving L1, then to the L2 3-35 on the subsequent L2 clock rise 3-31. The timing for the slow path is characterized by the changed data being presented on the output of the latch more than one receiving clock cycle later.

3. Continuous Operation in Any One Mode (Slow Path, Normal Path, Fast Path)

If the receiving latch were to operate in any one of these three modes continuously, it would appear to behave as a transparent, normal, or double latch, the receiving data would look much like the driven data with a delay, and the behavior that would be caused by an asynchronous boundary would not be occurring. But, in reality, the driving side clocks 1-11, 2-11, 3-11 and the receiving side clocks 1-25, 1-31, 2-25, 2-31, 3-25, 3-31 are constantly changing the phase relationship between them because they are running independently with no mechanism to keep this phase drift from occurring. Depending on the relative frequency of the two clocks, the phase may change by big increments or small increments. Problems occur when this phase drift moves the receiving latch behavior from one of the three modes of slow path, normal path, and fast path to another one of the modes.

4. Changes between Modes (Slow Path, Normal Path, Fast Path)

Moving from normal mode to fast mode could cause a driven transition to not be seen at all at the output of the receiving latch if the driven transition does not have enough duration. Enough duration would be at least more than the width of one receiving side clock pulse. The same occurs when switching from slow mode to normal mode. The worst case in this model would be switching from slow mode to fast mode, where the duration of the input signal would need to be at least more than the width of two receiving side clock pulses in order to guarantee that it would be presented on the output of the receiving latch. Even when the incoming signal has enough duration to be presented on the output of the receiving latch, its duration on the receiver output will be lessened by the width of a receiving clock pulse or two when switching from slow mode to fast mode. This switching is sufficient to model transition effect for asynchronous receiver behavior.

Moving from fast mode to normal mode could cause the data on the output to be held for an extra receiver clock cycle as the new data coming in takes a slower path through the latch. So, a signal which was only one receiving side clock pulse width when it was driven and managed to get through the 'fast path' mode of the receiving latch will have a longer than one clock pulse duration on the output of the receiver latch as the new data transition misses the fast path due to clock phase shifting and passes through the latch on the normal path. The same would happen for the normal model to slow mode shift.

Switching from fast mode to slow mode would add even one more cycle to the duration of the previous data pulse. Beyond that, however, it has the potential to create a 'glitch' where old data stored in the internal latches of the asynchronous behavioral model can be presented after new data has been seen. Basically, a single transition on the driven data appears as multiple transitions on the receiver latch output. This occurs when the latch is operating in fast mode, a transition is presented and passed through to the receiver output the same cycle. The next cycle, the latch switches to slow mode and presents the old data saved in the slow mode latch which is the value from before the transition that was presented on the previous cycle, and finally, the data from the recent transition makes it into the slow mode latch on the next cycle and is presented on the latch output. The output of the receiver latch in this switching case where data across the async boundary switches from datax to datay, is - - - datax-datay-datax-datay - - - . This behavior can be used to verify that the logic on the receiving side of the async boundary can handle glitching if that was what was intended. Generally, however, glitching should be avoided in the design.

5. Eliminating Unused Modes

Many designs will not be able to handle glitches on the interface, and may not be able to handle both the early mode and late modes that the async latch model can create. If it is known and can be proven that glitching will not occur, glitching can be disabled using a setup bit in the enable mask. If it is known and can be proven that only early mode-normal mode, or normal mode-late mode behavior is required, late or early mode behavior can be disabled by the mode enable mask. Also, if it is desired to run in only one mode with no switching, the other two modes can be disabled. This allows normal behavior if desired in order to run without asynchronous effects or to attempt asynchronous testing through other means such as varying the clock rates on the different clock sections without rebuilding the simulation model.

6. Normal Mode—Late Mode Modeling by Modeling L1–L2 Latches as L2 Latches

Varying clock rates on the different clock sections and modeling the L1L2 latches as L2 latches only can achieve the some of the normal mode-late mode behavior. The cost to do this is that multiple simulation cycles need to be run for each L1L2 latch cycle. The number of cycles is generally the number of cycles required by the slowest clock section and depends on the ratio between clock sections desired. If the ratio desired is 2.0 ns to 1.9 ns, then the slowest clock section would need 20 simulation cycles in order to maintain the 20:19 clock ratio. This generally has a performance impact on the simulation which could be as bad as multiplying simulation time by the number of cycles per L1L2 latch cycle depending on the simulator used.

7. Modeling of Multi-Bit Buses

Using a model that models the L1L2 latches with discrete L1 and L2 parts achieves early mode behavior also but at a cost of a bigger model with discrete L1 and L2 latches, and additional simulation cycles per L1L2 latch cycle in order to get transparent behavior from the latches. This method of varying the clock rates on the clock sections falls short in that it will not produce 'glitching' due to combinational logic between the driving latches and the receiving latches as the real arrival, rise and fall times of the signals feeding the combinational logic is quantized in a cycle simulator and possibly in an event simulator such that all of the inputs are ready at the same time.

Similarly, timing differences on individual bits of a multi-bit bus, or of one or more buses that are used together are not conventionally modeled.

Since the method and program product described herein models the behavior that can result from the asynchronous clock phase shifting directly with early-normal-late data latching, the async latch model will work well in a model where only the L2 portion of the latches is modeled, or where the L1 and L2 portion of the latches are modeled. This saves simulation time when the L2 only model can be used. The async latch model can be used in conjunction with varying the clock ratios between clock sections to thoroughly test the asynchronous behavior without having to push the clock ratios to the extremes. Some care must be taken not to push beyond the capability of the design as both varying the clock ratios and using the asynchronous latch have some overlapping effects on signal arrival times and the effect can be compounded.

The invention handles the problem of variable timings on individual bits on an interface by allowing the fast-normal-slow mode behavior for each bit to operate independently. The mode bits can be initialized to a different state for each bit, or the behavior of the async latch model can be relied on to get the modes out of phase for the individual bits. The invention only updates the mode for each bit when the bit changes state. So as long as bits are not being changed in unison (random data being sent), the mode state for the bits should diverge and yield a mix of mode state changes across the individual bits in a multi-bit bus and other buses on the same or different interface.

8. Switching between Operational States of the Model

The control part of the invention for switching between the operational states of the behavioral model can be tailored to the specific need of the design under test. For instance, if it is known that glitching is never needed, transitions that could cause glitching can be permanently disabled. The control portion of the invention consists of a pseudo-random number generator, for example, a logical shift feedback register, a set of control mask bits to enable/disable slow-normal-fast mode and glitching, and a state machine for each bit to indicate the current mode and handle switching between the modes based on input from the current mode, control mask bits, pseudo-random number, and incoming and/or latched data. The output from the control portion is the mode select bits to control the MUX for each bit. The random number and mode bits have default values appropriate to the usage which can be overridden with a different initial value as needed.

The capabilities of the present invention can be implemented in software, firmware, hardware or some combination thereof.

The timing diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

9. Program Product

The invention may be implemented, for example, by having the hardware description language execute a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for behavior modeling.

This signal-bearing medium may comprise, for example, memory in server. The memory in the server may be non-volatile storage, a data disc, or even memory on a vendor server for downloading to a processor. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++".

Additionally, the program code may, for example, be compressed, encrypted, or both, and may include executable files, script files and wizards for installation, as in Zip files and cab files. As used herein the term machine-readable instructions or code residing in or on signal-bearing media include all of the above means of delivery.

10. Other Embodiments

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of analyzing an asynchronously clocked system having independently clocked subsystems with clock boundaries therebetween, comprising:
   a. identifying a boundary between two independently clocked subsystems;
   b. identifying behavior at the boundary between the two independently clocked subsystems; and
   c. modeling a latch at the boundary between the two independently clocked subsystems with Level 1 and Level 2 latches therebetween with a behavior model, said behavioral model comprising user selectable data receiver time delays and including a random number generator to select said user selectable data receiver time delays by masking non-selected delays.

2. The method of claim 1 wherein said behavioral model further includes glitches.

3. The method of claim 1 comprising modeling the Level 2 latches.

4. The method of claim 3 comprising modeling the Level 1 and Level 2 latches.

5. The method of claim 3 comprising combining asynchronous latch behavior with variable clock section clocking ratios.

6. The method of claim 1 comprising modeling independent behavior for individual bits of a multi-bit bus.

7. The method of claim 1 comprising modeling independent behavior for individual buses of an interface.

8. A method of analyzing an asynchronously clocked system having independently clocked subsystems, with Level 1 and Level 2 latches therebetween with clock boundaries therebetween, comprising:
   a. identifying a boundary between two independently clocked subsystems:
   b. identifying behavior at the boundary between the two independently clocked subsystems; and
   c. modeling a latch at the boundary between the two independently clocked subsystems with a behavior model, said behavioral model comprising user selectable data receiver time delays selectable between early, normal, and late receiver times and including a random number generator to select receiver time delays.

9. A program product tangibly embodying a program of computer readable instructions executable by a digital processing apparatus to control a computer system to analyze an asynchronously clocked system having independently clocked subsystems with clock boundaries therebetween, by a method comprising:
   a. identifying a boundary between two independently clocked subsystems;
   b. identifying behavior at the boundary between the two independently clocked subsystems; and
   c. modeling a latch at the boundary between the two independently clocked subsystems with Level 1 and Level 2 Latches therebetween with a behavior model, said behavioral model comprising user selectable data receiver time delays, wherein said delays are user selectable by masking non-selected delays, and including a random number generator to select receiver time delays.

10. The program product of claim 9 wherein said behavioral model further includes glitches.

11. The program product of claim 9 wherein said model is adapted for modeling the Level 2 latches.

12. The program product of claim 11 wherein said model is adapted for modeling the Level 1 and Level 2 latches.

13. The program product of claim 11 wherein said model is adapted for combining asynchronous latch behavior with variable clock section clocking ratios.

14. The program product of claim 9 wherein said model is adapted for modeling independent behavior for individual bits of a multi-bit bus.

15. The program product of claim 9 wherein said model is adapted for modeling independent behavior for individual buses of an interface.

16. A program product tangibly embodying a program of computer readable instructions executable by a digital processing apparatus to control a computer system to analyze an asynchronously clocked system having independently clocked subsystems with clock boundaries therebetween, by a method comprising:
   a. identifying a boundary between two independently clocked subsystems;
   b. identifying behavior at the boundary between the two independently clocked subsystems; and
   c. modeling a latch at the boundary between the two independently clocked subsystems with Level 1 and Level 2 with a behavior model, said behavioral model comprising user selectable data receiver time delays, and including a random number generator to select receiver time delays, wherein said delays are selectable between early, normal, and late receiver times and switchable between said receiver times.

* * * * *